United States Patent
Jo et al.

(10) Patent No.: US 10,490,504 B2
(45) Date of Patent: Nov. 26, 2019

(54) CHIP ON PRINTED CIRCUIT UNIT AND DISPLAY APPARATUS COMPRISING THE SAME

(71) Applicant: LG Display Co., Ltd., Seoul (KR)

(72) Inventors: SuHyeon Jo, Goyang-si (KR); NogSu Chung, Seoul (KR)

(73) Assignee: LG Display Co., Ltd., Seoul (KR)

( * ) Notice: Subject to any disclaimer, the term of this patent is extended or adjusted under 35 U.S.C. 154(b) by 5 days.

(21) Appl. No.: 15/638,729

(22) Filed: Jun. 30, 2017

(65) Prior Publication Data
US 2018/0005948 A1    Jan. 4, 2018

(30) Foreign Application Priority Data
Jun. 30, 2016    (KR) .................. 10-2016-0083098

(51) Int. Cl.
| | | |
|---|---|---|
| H05K 1/18 | (2006.01) | |
| H01L 23/538 | (2006.01) | |
| G02F 1/1345 | (2006.01) | |
| H01L 23/10 | (2006.01) | |
| H05K 1/03 | (2006.01) | |
| H05K 1/14 | (2006.01) | |
| H05K 3/28 | (2006.01) | |
| H05K 1/11 | (2006.01) | |

(52) U.S. Cl.
CPC ........ *H01L 23/5385* (2013.01); *G02F 1/1345* (2013.01); *G02F 1/13452* (2013.01); *H01L 23/10* (2013.01); *H05K 1/0393* (2013.01); *H05K 1/118* (2013.01); *H05K 1/142* (2013.01); *H05K 3/284* (2013.01); *H01L 23/5387* (2013.01); *H05K 1/115* (2013.01); *H05K 1/147* (2013.01); *H05K 2201/09409* (2013.01); *H05K 2201/10128* (2013.01); *H05K 2201/10681* (2013.01)

(58) Field of Classification Search
CPC ... G02F 1/1345; H01L 23/10; H01L 23/5385; H05K 1/0393; H05K 1/142; H05K 3/284
USPC .................................................. 361/749, 761
See application file for complete search history.

(56) References Cited

U.S. PATENT DOCUMENTS

| | | | | |
|---|---|---|---|---|
| 5,737,272 A * | 4/1998 | Uchiyama | ........... | G02F 1/13452 257/E23.004 |
| 5,777,610 A * | 7/1998 | Sugimoto | .............. | H05K 1/147 345/206 |
| 6,433,414 B2 * | 8/2002 | Saito | .................... | H01L 23/4985 257/679 |
| 6,444,921 B1 * | 9/2002 | Wang | ................ | H01L 23/49827 174/254 |
| 6,559,524 B2 * | 5/2003 | Seko | ..................... | H01L 21/563 174/259 |
| 6,972,963 B1 * | 12/2005 | Chou | .................. | H01L 23/4985 174/252 |
| 7,705,812 B2 * | 4/2010 | Yuda | .................... | G02F 1/13452 345/206 |

(Continued)

*Primary Examiner* — Yuriy Semenenko
(74) *Attorney, Agent, or Firm* — Polsinelli PC (57) ABSTRACT

Disclosed is a printed circuit unit that includes a flexible member which has an upper surface and a lower surface and includes a first end and a second end. An output pad is disposed at the first end and is implemented to be connected to a bent display panel. A connecting unit is disposed at the second end and is implemented to be connected to a system board, and a drive chip is located between the output pad and the connecting unit.

8 Claims, 6 Drawing Sheets

(56) References Cited

U.S. PATENT DOCUMENTS 9,818,732 B2 * 11/2017 Jung ................. H01L 23/49827
2009/0296330 A1 * 12/2009 Ho ........................... G06F 1/18
361/679.4

* cited by examiner

CHIP ON PRINTED CIRCUIT UNIT AND DISPLAY APPARATUS COMPRISING THE SAME

CROSS-REFERENCE TO RELATED APPLICATIONS

This application claims the priority of Korean Patent Application No. 10-2016-0083098 filed on Jun. 30, 2016, in the Korean Intellectual Property Office, the disclosure of which is incorporated herein by reference in its entirety.

BACKGROUND

Field of the Disclosure

The present disclosure relates to a display device, and more particularly, to a chip on printed circuit unit and a display device including the same.

Description of the Related Art

Various shapes and functions are required for recent display devices which display information and interact with a user.

The display devices include a plurality of pixels configured by a plurality of sub pixels which output light with different wavelengths to display various information. Among such display devices, an active matrix type display device, in which a thin film transistor for driving the respective pixels and a pixel electrode connected to the thin film transistor are disposed in a matrix form, has excellent resolution and excellent moving image implementation ability. Therefore, the active matrix type display device attracts the most attention.

In order to drive the pixels disposed in a matrix form, so-called drive chips (e.g. drive ICs or integrated circuits) are mounted in the display device to be connected to data lines (or signal lines) or scan lines (or gate lines). A source drive IC supplies a data signal to the data lines and a gate drive IC is synchronized with the data signal to sequentially supply scan signals (or gate pulses) to the scan lines.

As a method of mounting the drive chips on the display device, a method of bonding a flexible circuit film on which a drive chip is mounted to the display device and a chip on glass (COG) method of directly bonding the drive chip onto the substrate has been known.

A flexible film for mounting a drive chip includes a chip on film (COF) or a tape carrier package (TCP). The flexible film included in the display device is connected to a printed circuit board (PCB), which primarily provides image information, such as a system board.

As described above, the display device basically requires a display panel including pixels which output light by means of liquid crystal or an organic light emitting layer, a flexible film including a drive chip, and a PCB such as a system board.

Additionally, a touch sensing system having various functions such as multi-touch, force touch, or haptic can also be implemented in such a display device. Further, a flexible, thin, and lightweight display device that can be implemented in different types of products, such as a smart watch or a wearable device is desirable.

SUMMARY

The present disclosure has been made in an effort to provide a printed circuit unit which implements a printed circuit combined with a flexible member to mount a drive chip and various parts in the flexible member to increase a degree of integration of the parts. A display device including such printed circuit unit is also provided.

The characteristics of the present disclosure are not limited to the above-mentioned, and other characteristics, which are not mentioned above, can be clearly understood by those skilled in the art from the following descriptions.

According to an aspect of the present disclosure, there is provided a printed circuit unit. The printed circuit unit includes a flexible member equipped with a drive chip which processes image information and at least two wiring layers, a connecting unit equipped with an input electrode, and an output pad equipped with an output electrode which protrudes from one surface of the flexible member in which the drive chip and the connecting unit are in contact with the flexible member to be connected to each other through an electrode equipped in the wiring layer.

According to another aspect of the present disclosure, there is provided a display device. The display device includes a printed circuit film equipped with at least two electrode layers and a contact pad, a system board connected to a connector in the printed circuit film, and a display panel which is connected to the contact pad to be bent in which a driving unit which drives the display panel and the connector are directly mounted in the printed circuit film to be integrally formed.

According to still another aspect of the present disclosure, there is provided a printed circuit board. The printed circuit board includes a flexible member which has an upper surface and a lower surface and includes a first end and a second end, an output pad which is disposed at the first end and is implemented to be connected to a bent display panel, a connecting unit which is disposed at the second end and is implemented to be connected to a system board, and a drive chip between the output pad and the connecting unit.

Detailed matters of other exemplary aspects are included in the detailed description and the drawings.

According to exemplary aspects of the present disclosure, a small and light printed circuit unit equipped with a drive chip and various parts may be obtained.

According to the exemplary aspects of the present disclosure, a printed circuit unit in which an arrangement of a drive chip and a connecting unit is changed is applied to minimize a thickness of a bent display device.

The effects according to the present disclosure are not limited to the contents exemplified above, and more various effects are included in the present specification.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION OF THE ASPECTS

Advantages and features of the present disclosure, and methods for accomplishing the same will be more clearly understood from exemplary aspects described below with reference to the accompanying drawings. However, the present disclosure is not limited to the following exemplary aspects but may be implemented in various different forms. The exemplary aspects are provided a person having ordinary skill in the art to practice or implement the inventive features described herein, and the present disclosure can be defined by the appended claims.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may have been omitted to avoid unnecessarily obscuring the subject matter of the present disclosure.

The terms such as "including," "having," and "consist of" used herein are generally intended to allow other components to be added unless the terms are used with the term "only". Any references to singular elements may include a plurality of such elements unless expressly stated otherwise.

Components are interpreted to include an ordinary error range even if not expressly stated.

When the position relationship between two parts is described using the terms such as "on", "above", "below", and "next", one or more parts may be positioned between the two parts unless the terms are used with the term "immediately" or "directly" is not used.

When the relation of a time sequential order is described using the terms such as "after", "continuously to", "next to", and "before", the order may not be continuous unless the terms are used with the term "immediately" or "directly".

Although the terms "first", "second", and the like are used for describing various components, these components are not confined by these terms. These terms are merely used for distinguishing one component from the other components. Therefore, a first component to be mentioned below may be a second component in a technical concept of the present disclosure.

The terminologies "X-axis direction", "Y-axis direction", and "Z-axis direction" are not interpreted solely by a geometric relationship in which the relationship therebetween is vertical, but may have broader directivity within a range where the configuration of the present disclosure functionally operates.

The terminology "at least one" may be understood to include all suggestable combinations from one or more related items. For example, the meaning of "at least one" of a first item, a second item, and a third item may refer not only each of the first item, the second item, and the third item, but also a combination of all items suggested from two or more of the first item, the second item, and the third item.

In the present disclosure, the flexible display device refers to a display device provided with flexibility and may be used as the same meanings as a bendable display device, a rollable display, a unbreakable display device, a stretchable display device or a foldable display device. In the present disclosure, the flexible organic light emitting display device is one example of various flexible display devices.

The features of various aspects of the present disclosure can be partially or entirely bonded to or combined with each other and can be interlocked and operated in technically various ways, and the aspects can be carried out independently of or in association with each other.

A complex design is required for a PCB on which various parts are mounted in addition to a drive chip to drive the display device having various functions. In this case, in order to implement a thin and small display device, a degree of integration of various parts, for example, a transistor, a resistor, a diode, an arithmetic chip, a capacitor, a connector, and an IC needs to be increased.

Therefore, in order to reduce the size of the display device, the present inventors recognized the necessity of combining a PCB, on which a drive chip driving a display panel and various parts are mounted, and a flexible member (or a flexible film). In order to implement the display device which satisfies the above-mentioned requirement, the parts should be small-sized, flexible, and combinable and thus various technologies are used therefor.

Specifically, it is difficult for the flexible member to accommodate a printed circuit with a complex design, unlike a typical PCB. Therefore, the drive chip and various parts are typically not mounted on the flexible member.

Therefore, the inventors of the present disclosure conducted research and development to implement a complex printed circuit on the flexible member to mount various parts on the flexible member, thereby increasing a degree of integration of the parts. As a result, the inventors of the present disclosure have been able to reduce the size of the display device equipped with a display panel by increasing a degree of integration of the parts.

Namely, the present inventors specifically recognized that a separate PCB having a conventional connector need not be employed if a flexible member (e.g., COF: Chip-on-film) can be modified to accommodate an "integrated connector" that allows for higher component integration, improved interfacing and increased connectivity among electrical and/or electronic components within a display device. Development of such flexible member is not a simple matter, because changes to circuit design, wiring arrangements, and overall component layout are some of the many factors that are technically challenging and thus need to be carefully considered as a whole. For such technical improvements, the trade-offs between various issues, such as cost, practical implementation, technical effects, etc. need to be balanced as well.

As a result of such technical considerations, the present inventors have developed a special flexible member. In the present disclosure, this is referred to as a printed circuit unit comprising an integrated circuit, on a flexible member, which performs certain processing of signals for a display panel and signals for a system control board, and an integrated connector, integrated into said flexible member, that provides an electrical interface between the integrated circuit and the display panel and between the integrated circuit and the system control board, which forgoes the need of a separate printed circuit board having a separate connector thereon.

The integrated connector may have a connecting unit at one end thereof that provides an interface with the system control board, a contact pad unit at another end thereof that provides an interface with the display panel. In addition, a particular multi-layered wiring structure provides electrical connections between the integrated circuit, the connecting unit, and the contact pad unit. Such multi-layered wiring may include at least two conductive layers stacked together but insulated from each other, and providing a conductive path between the integrated circuit, the connecting unit, and the contact pad unit via contact holes leading to at least one among the upper and lower surfaces of the flexible member. The multi-layered wiring can also include one or more terminals on at least one among the upper and lower surfaces of the flexible member that allow additional electrical elements to be connected to the integrated connector. The integrated circuit and the connecting unit can both be on the same surface or respectively on different surfaces among the upper and lower surfaces of the flexible member.

Hereinafter, various exemplary aspects of the present disclosure will be described in detail with reference to accompanying drawings.

Figure 1:
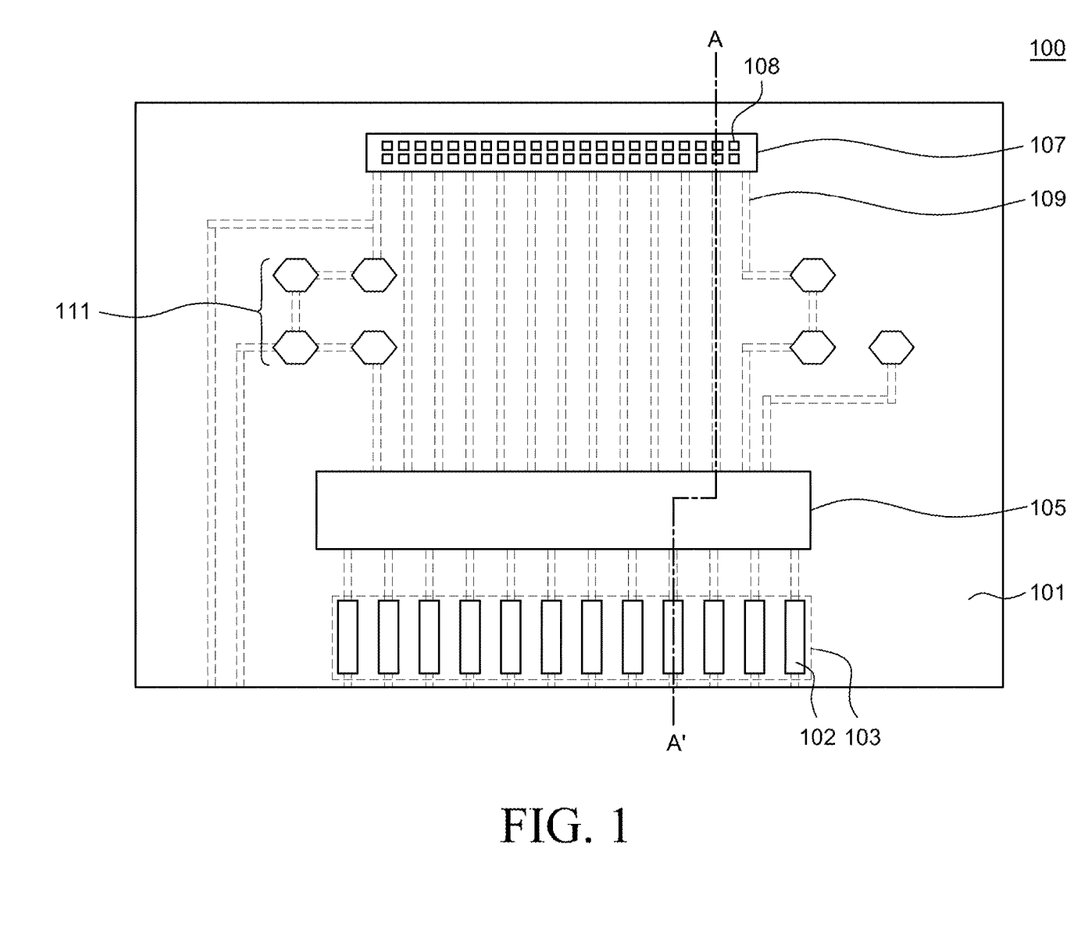
FIG. 1 is a schematic plan view for explaining a printed circuit unit equipped with a drive chip according to an exemplary aspect of the present disclosure.

FIG. 1 is a schematic plan view illustrating a printed circuit unit equipped with a drive chip according to an exemplary aspect of the present disclosure.

As illustrated in FIG. 1, a printed circuit unit (or a printed circuit board) 100 may include a flexible member 101, an electrode 109, a plurality of parts 111, a drive chip 105, a connecting unit 107, and an output pad 103.

The flexible member (e.g. thin film substrate) 101 may include a plurality of layers. For example, the flexible member 101 may include a polyimide layer, a plurality of parts 111, and at least two wiring layers. The plurality of parts 111 may include a first part and a second part, such as a resistor, a transistor, a diode, and a capacitor, but is not limited thereto. Further, the wiring layers may include an electrode 109.

The plurality of parts 111 and the drive chip 105 may be disposed on the same surface or different surfaces of the flexible member 101. Specifically, the first part and the second part may be disposed on the same surface as the drive chip 105 or on a surface which is different from that of the drive chip 105. Alternatively, only one of the first part and the second part may be disposed on the same surface as the drive chip 105. In this case, an electrical connection relationship between parts may be formed through an electrode such as a first electrode or a second electrode.

The plurality of parts 111 and the drive chip 105 may be disposed in consideration of a connection relationship through a plurality of electrodes 109. For example, the plurality of parts 111 and the drive chip 105 may be disposed on different surfaces of the flexible member 101. In this case, the flexible member 101 may include a contact hole (or via) for electrical connection between the plurality of parts 111 disposed on different surfaces.

The wiring layers may be formed to have a multilayered structure. The wiring layers may be at least two or more layers. The number of wiring layers may vary depending on a design complexity of the flexible member 101, the type of parts and the total number of parts. Also, the wiring layers may include a protective layer and an electrode 109.

The electrode 109 may electrically connect the plurality of parts 111 and the drive chip 105. The electrode 109 may be formed of a material having a good electrical mobility. For example, the electrode 109 may be formed of metal such as copper (Cu), but is not limited thereto.

The electrode 109 may include a first electrode and a second electrode. In this case, the first electrode and the second electrode may be electrodes on different layers. Further, since the electrode 109 may include an additional electrode in accordance with a design and a connection relationship between components, the electrode is not limited to the first electrode and the second electrode.

The flexible member 101 including a plurality of wiring layers such as the first electrode and the second electrode may have many advantages in that the number of electrical connections between a plurality of parts 111 to be mounted can be increased, the number of parts 111 can be increased, and a highly integrated flexible member 101 which implements various functions can be configured. For example, the first part and the second part are disposed on different surfaces of the flexible member 101 and are electrically connected to each other through the second electrode. In this case, the first part and the second part can be connected to each other regardless of the first electrode. Therefore, a plurality of various different parts 111 may be disposed in the flexible member 101. As described above, in order to further facilitate the electrode design of the flexible member 101, a plurality of wiring layers may be provided. Further, an arrangement of the electrode 109 and the plurality of parts 111 may vary in accordance with layout specifications and requirements.

The protective layer may protect an electrode or serve as an insulating layer between different parts or electrodes. A polyimide layer may be used as the protective layer. However, the protective layer is not limited thereto, but the protective layer may be formed by materials other than polyimide or the polyimide layer that can be additionally used to form the flexible member 101.

The drive chip 105 may be disposed on one surface of the flexible member 101. In this case, the drive chip 105 may be in contact with the flexible member 101. The drive chip 105 may be electrically connected to the plurality of parts 111, the connecting unit 107, and the output pad 103 through an electrode.

The drive chip 105 may be equipped in the flexible member 101. The drive chip 105 is a part which processes data for displaying an image and a driving signal for processing the data. As the resolution of the image to be displayed becomes higher, a highly integrated drive chip 105 may be used. That is, in order to display images with a high resolution, the number of a data line, a source line, and a gate line in the display device needs to be increased and a structure of the drive chip 105 which controls the lines may be complicated. Further, the larger number of electrodes 109 is connected to the drive chip 105 to be equipped in the flexible member 101.

In addition to the drive chip 105, in order to process image information with a high resolution, the connecting unit 107 and the output pad 103 need to be connected to each other by a larger number of electrodes 109. Alternatively, without increasing the number of electrodes 109, some electrodes 109 can be sequentially shared in accordance with time.

The connecting unit 107 may be disposed on one surface of the flexible member 101. In this case, the connecting unit 107 may be in contact with the flexible member 101. The connecting unit 107 may include an input electrode 108. In this case, the input electrode 108 of the connecting unit 107 and the drive chip 105 may be connected to each other. The connecting unit 107 may connect the printed circuit unit 100 to a so-called set part, such as a system board. In this case, the connecting unit 107 allows the printed circuit unit 100 on which the drive chip 105 and the plurality of parts 111 are disposed to be supplied with image information which is an electrical signal and a current. Therefore, the connecting unit 107 may be a socket type part or element which is integrally formed to be supplied with data or power, but is not limited thereto.

The output pad 103 may include an output electrode 102. In this case, the output electrode 102 may protrude from one surface of the flexible member 101. Therefore, the output pad 103 may be connected to the display panel through the output electrode 102. In this case, the output electrode 102 may be disposed by extending the electrode 109 and the output pad 103 and the display panel may be bonded using a conductive ball and resin.

Figure 2:
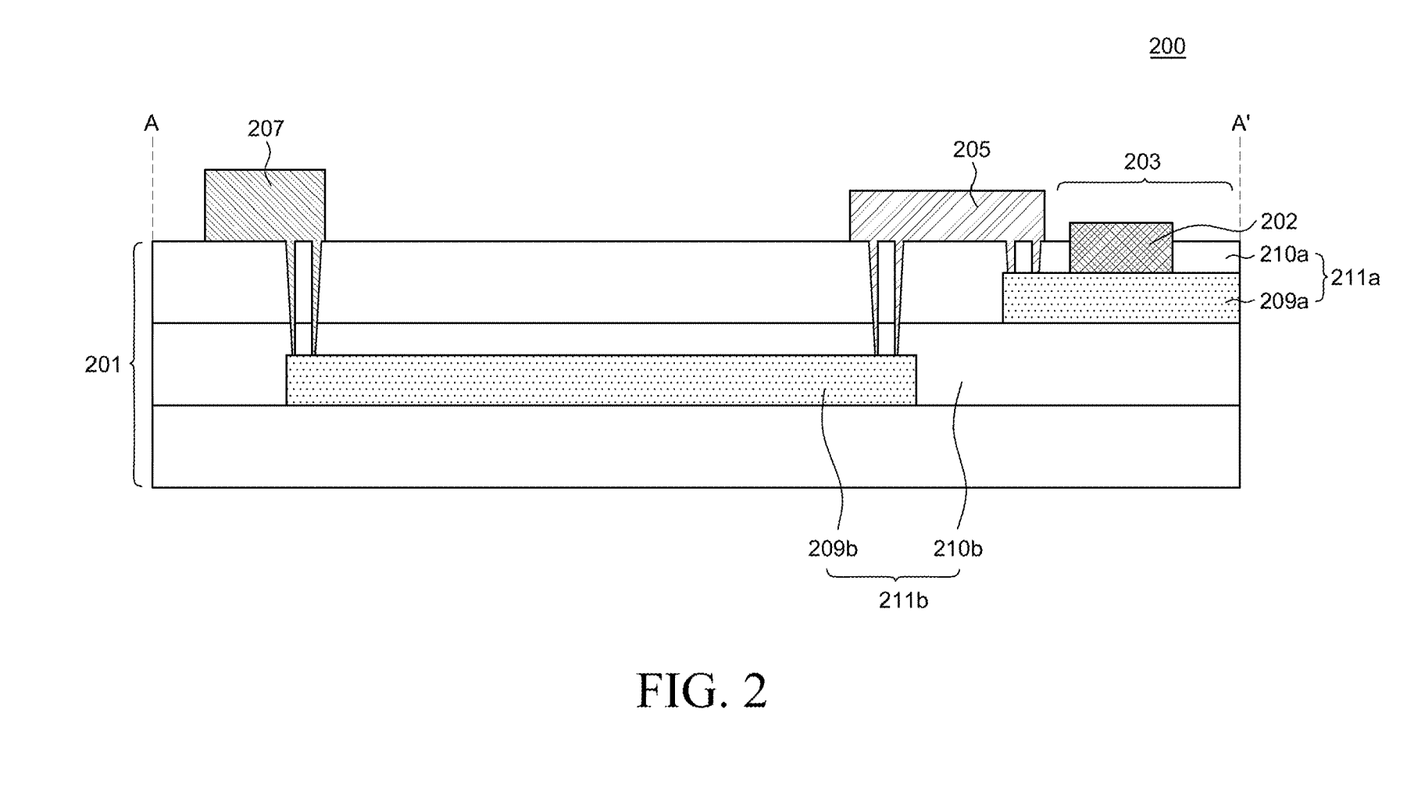
FIG. 2 is a schematic plan view for explaining a printed circuit unit equipped with a drive chip taken along A-A' of FIG. 1.

FIG. 2 is a schematic plan view for explaining a printed circuit unit equipped with a drive chip taken along A-A' of FIG. 1.

The printed circuit unit 200 illustrated in FIG. 2 is a view for explaining a connection relationship between components of the printed circuit unit 100 illustrated in FIG. 1 and a structure thereof. The components are substantially the same so that a redundant description will be omitted.

As illustrated in FIG. 2, a printed circuit unit 200 includes a flexible member (e.g. thin film substrate) 201, wiring layers 211a and 211b, a drive chip 205, a connecting unit 207, and an output pad 203.

The flexible member 201 has one surface (or a front surface or an upper surface) and another surface (or a rear surface or a lower surface) and includes a first end and a second end. One surface of the flexible member 210 faces a bent (or bendable) display panel and the other surface is directed to the opposite direction of the bent display panel. In this case, the connecting unit 207 and the drive chip 205 may be disposed on one surface or on another surface of the flexible member 201 or on different surfaces of the flexible member. In this case, the output pad 203 may be disposed at the first end of the flexible member 201. The output pad 203 may be implemented to connect the bent display panel and the printed circuit unit 200. Further, the connecting unit 207 may be disposed at the second end of the flexible member 201. The connecting unit 207 may be implemented to be connected to the system board. In this case, the drive chip 205 may be disposed between the output pad 203 and the connecting pad 207.

In FIG. 2, for example, both the connecting unit 207 and the drive chip 205 are disposed on one surface of the flexible member 201, but the present disclosure is not limited thereto.

The wiring layers 211a and 211b may be formed to have a multilayered structure. The flexible member 201 may include at least two wiring layers 211a and 211b. In this case, the wiring layers 211a and 211b include electrodes 209a and 209b.

The electrodes 209a and 209b disposed on the wiring layers 211a and 211b need to supply an electrical signal and a current so that the electrodes 209a and 209b may be disposed by a metal electrode having relatively a low electrical resistance. In this case, when the metal electrode is exposed to air, the metal electrode may be oxidized. When the electrodes 209a and 209b are oxidized, an electrical resistance is increased or changed. Therefore, noise signals or interference may be generated due to an electrical signal which drives the image. Further, when the oxidization severely progresses, the electrode becomes non-conductive so that electrical connection may become disconnected. In order to protect the electrodes 209a and 209b which are formed of metal, the electrodes may be covered by the protective layers 210a and 210b.

The protective layers 210a and 210b may be formed of permanent coating materials such as a solder resist. In this case, when the parts which are electrically connected to the electrodes 209a and 209b are covered by the protective layers 210a and 210b, and are mounted in the flexible member 201, the parts may be suppressed from being electrically connected to an unintended electrode. That is, the protective layers 210a and 210b may protect the electrodes 209a and 209b and serve as an insulating layer between other parts and electrodes 209a and 209b.

The electrodes 209a and 209b may electrically connect the drive chip 205, the connecting unit 207, and the output pad 203. In this case, the electrodes 209a and 209b disposed on the wiring layers 211a and 211b are insulated from each other and electrically connected to the drive chip 205, the connecting unit 207, and the output pad 203 through a contact hole.

Specifically, the electrodes 209a and 209b may include a first electrode 209a and a second electrode 209b. The first electrode 209a and the second electrode 209b may be electrodes on different layers. The first electrode 209a may be covered by the first protective layer 210a, and the second electrode 209b may be covered by the second protective layer 210b.

In this case, the flexible member 201 includes the output pad 203 including an output electrode 202 protruding from one surface of the flexible member 201. Further, the drive chip 205 and the connecting unit 207 are mounted to be in contact with the flexible member 201. The first electrode 209a may be connected to the output electrode 202 equipped in the output pad 203 and the drive chip 205 through a contact hole. Therefore, the first electrode 209a may electrically connect the output electrode 202 equipped in the output pad 203 and the drive chip 205. The second electrode 209b may be connected to the drive chip 205 and the connecting unit 207 through a contact hole. Therefore, the second electrode 209b may electrically connect the drive chip 205 and the connecting unit 207.

In this case, the drive chip 205 may be disposed on the first protective layer 210a. The output pad 203 may protrude out of the first protective layer 210a. Therefore, the drive chip 205 may be disposed on the same surface as one surface of the flexible member 201 on which the output pad 203 is disposed. In this case, the drive chip 205 is in contact with the first protective layer 210a to be electrically connected to the first electrode 209a and the second electrode 209b.

Further, the connecting unit 207 may be disposed on the first protective layer 210a. Therefore, the connecting unit 207 may be disposed on the same surface as one surface of the flexible member 201 on which the output pad 203 is disposed. That is, the connecting unit 207 may be disposed on the same surface as the drive chip 205. In this case, the connecting unit 207 is in contact with the first protective layer 210a to be electrically connected to the second electrode 209b.

The output pad 203, the drive chip 205, and the connecting unit 207 may be disposed on the same surface of the flexible member 201. In this case, the output pad 203, the drive chip 205, and the connecting unit 207 may be disposed on the flexible member 201 in consideration of the complexity of the printed circuit unit 200. Further, the output pad 203, the drive chip 205, and the connecting unit 207 may be disposed on the flexible member 201 by adjusting a distance between the parts in consideration of an electrical influence between such parts, for example, a possibility of occurrence of a parasitic voltage or influence due to generation of a noise.

That is, the flexible member 201 includes at least two wiring layers 211a and 211b and the output pad 203, the drive chip 205 and the connecting unit 207 disposed on the flexible member 201. Therefore, even though an integrated printed circuit unit 200 is designed, the influence between various parts may be minimized.

Further, all the output pad 203, the drive chip 205, and the connecting unit 207 are disposed on the flexible member 201 so that the printed circuit unit 200 may be made smaller and lighter. Further, the display device including the printed circuit unit 200 may also be made smaller and lighter when compared to display devices that lack the various features of the disclosure described herein.

According to the exemplary aspect of the present disclosure, one connecting unit 207 is disposed on the flexible member 201. However, additional connecting units may be disposed on the flexible member 201 in accordance with a design of the printed circuit unit 200. In this case, the additional connecting unit may be disposed on the same surface as the connecting unit 207 of the exemplary aspect of the present disclosure or disposed on the other surface.

Figure 3:
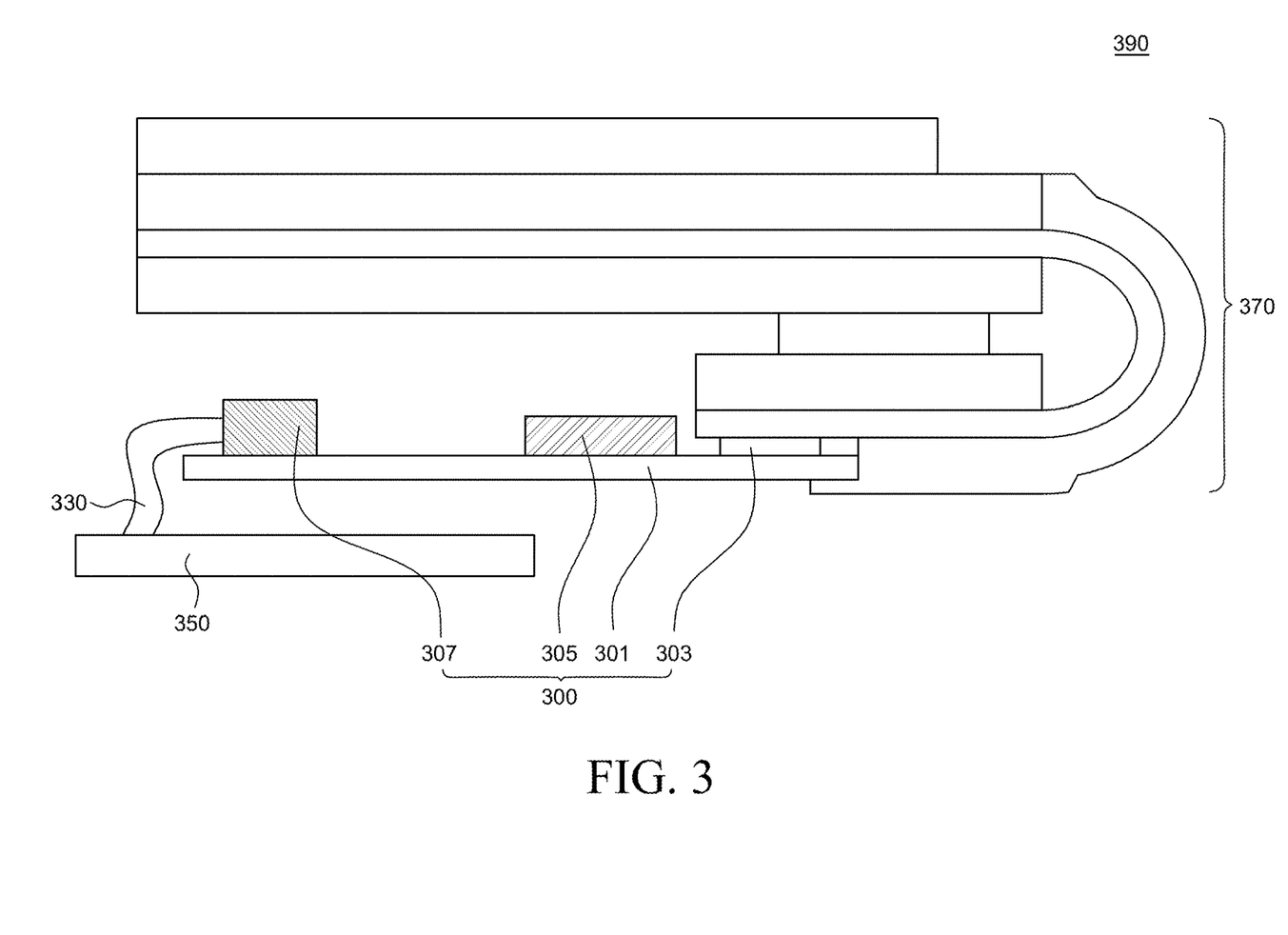
FIG. 3 is a schematic cross-sectional view for explaining a display device including a printed circuit unit equipped with a drive chip according to an exemplary aspect of the present disclosure.

FIG. 3 is a schematic cross-sectional view for explaining a display device including a printed circuit unit equipped with a drive chip according to an exemplary aspect of the present disclosure. FIG. 3 is a cross-sectional view of a display device 390 equipped with a printed circuit unit according to an exemplary aspect of the present disclosure of FIG. 2.

As illustrated in FIG. 3, the display device 390 includes a display panel 370, a printed circuit unit 300, and a system board 350.

The printed circuit unit (or a printed circuit film) 300 includes a flexible member (e.g. thin film substrate) 301 including at least two wiring layers (or electrode layers), a drive chip (or a driving unit) 305, an output pad (or a contact pad) 303, and a connecting unit (or connector) 307.

The flexible member 301 has an upper surface (or one surface or a front surface) and a lower surface (or the other surface or a rear surface) and includes a first end and a second end. In this case, the upper surface of the flexible member 301 faces a bent display panel 370 and the lower surface of the flexible member 301 is directed to an opposite direction of the bent display panel 370.

The output pad 303 may be disposed on the upper surface of the flexible member 301. In this case, the output pad 303 may be disposed at the first end of the flexible member 301. In this case, the output pad 303 may be implemented to connect the bent display panel 370 and the printed circuit unit 300.

The connecting unit 307 may be disposed on the upper surface of the flexible member 301. In this case, the connecting unit 307 may be disposed at the second end of the flexible member 301. The connecting unit 307 may be implemented to be connected to the system board 350.

The drive chip 305 may be disposed on the upper surface of the flexible member 301. In this case, the drive chip 305 may be disposed between the output pad 303 and the connecting unit 307. That is, both the connecting unit 307 and the drive chip 305 may be disposed on the upper surface of the flexible member 301. As described above, according to the arrangement of the connecting unit 307 and the drive chip 305, the flexible member 301 may be implemented by a shape which is not a rectangle in a plan view, that is, a shape which is different from the rectangle. Further, the lower surface of the flexible member 301 is implemented to utilize a space for another purpose.

Specifically, the drive chip 305 which drives the display panel 370 and the connecting unit 307 may be directly mounted in the printed circuit unit 300 to be integrally formed. In this case, the drive chip 305 and the connecting unit 307 may be disposed on the same surface of the printed circuit unit 300. Further, the drive chip 305 and the connecting unit 307 may be disposed on the same surface as the output pad 303 of the printed circuit unit 300.

The display panel 370 includes a pad unit corresponding to the output pad 303 of the printed circuit unit 300 and the pad unit of the display panel 370 and the output pad 303 of the printed circuit unit 300 may be electrically connected. In this case, the display panel 370 connected to the output pad 303 may be bent in an area connected to the output pad 303. Therefore, the printed circuit unit 300 may be disposed below the bent display panel 370. Accordingly, the drive chip 305 and the connecting unit 307 disposed on the flexible member 301 of the printed circuit unit 300 may face the other surface of the bent display panel 370.

In this case, the drive chip 305 and the connecting unit 307 may be disposed between the flexible member 301 and the display panel 370. The drive chip 305 and the connecting unit 307 which have particular thicknesses are disposed in a space between the printed circuit unit 300 and the bent display panel 370. Therefore, the thickness of the bent display device 390 may be reduced by as much as the thicknesses of the drive chip 305 and the connecting unit 307. That is, the thickness of the bent display device 390 may be minimized by changing the arrangement of the drive chip 305 and the connecting unit 307 of the printed circuit unit 300.

In this case, the system board 350 may be disposed below the printed circuit unit 300. The system board 350 may be connected to the connecting unit 307 through at least one connector film 330. The system board 350 may supply system control signals and/or power to the display panel 370. Therefore, the connecting unit 307 which is connected to the system board may be a so-called socket type part, but is not limited thereto.

Figure 4:
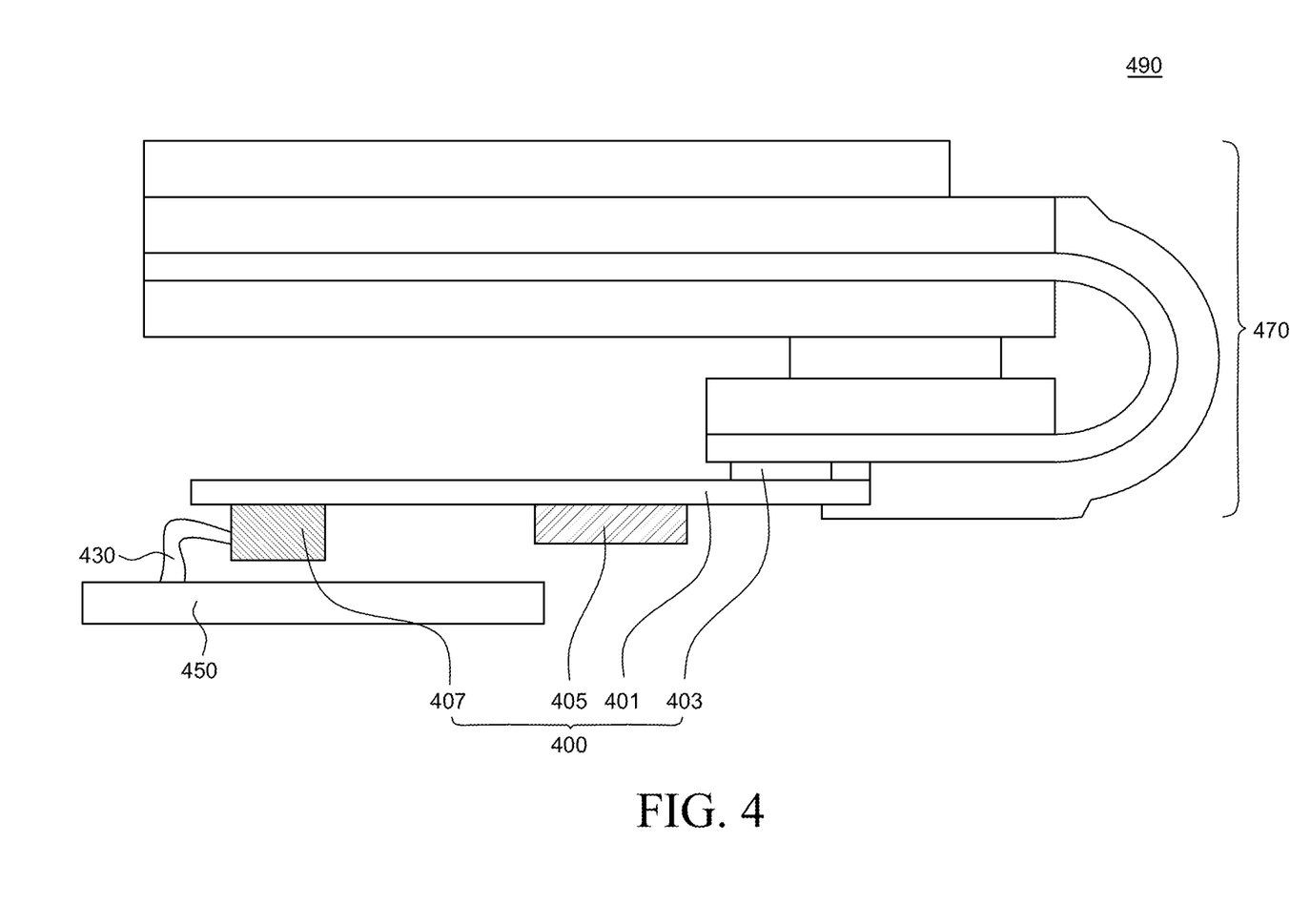
FIG. 4 is a schematic cross-sectional view for explaining a display device including a printed circuit unit equipped with a drive chip according to another exemplary aspect of the present disclosure.

FIG. 4 is a schematic cross-sectional view for explaining a display device including a printed circuit unit equipped with a drive chip according to another exemplary aspect of the present disclosure.

As compared with the display device illustrated in FIG. 3, in FIG. 4, a structure of the printed circuit unit is changed, but the other components are substantially the same. Therefore, a redundant description will be omitted.

As illustrated in FIG. 4, a printed circuit unit 400 includes a flexible member 401, a wiring layer, a drive chip 405, a connecting unit 407, and an output pad 403.

The flexible member (e.g. thin film substrate) 401 has an upper surface and a lower surface and includes a first end and a second end. In this case, the upper surface of the flexible member 401 faces a bent display panel 470 and the lower surface of the flexible member 401 is directed to an opposite direction of the bent display panel 470.

The output pad 403 may be disposed on the upper surface of the flexible member 401. In this case, the output pad 403 may be disposed at the first end of the flexible member 401. In this case, the output pad 403 may be implemented to connect the bent display panel 470 and the printed circuit unit 400.

The connecting unit 407 may be disposed on the lower surface of the flexible member 401. In this case, the connecting unit 407 may be disposed at the second end of the flexible member 401. The connecting unit 407 may be implemented to be connected to the system board 450.

The drive chip 405 may be disposed on the lower surface of the flexible member 401. That is, both the connecting unit 407 and the drive chip 405 are disposed on the lower surface of the flexible member 401. As described above, according to the arrangement of the connecting unit 407 and the drive chip 405, the flexible member 401 may be implemented by a shape which is not a rectangle in a plan view. Further, a space (gap) between the flexible member 401 and the bent display panel 470 which faces the upper surface of the flexible member 401 may be minimized.

Specifically, the flexible member 401 of the printed circuit unit 400 includes the output pad 403 including an output electrode which protrudes from one surface of the flexible member 401. Further, the drive chip 405 and the connecting unit 407 are mounted to be in contact with the flexible member 401. Therefore, the drive chip 405 may be disposed on the other surface corresponding to one surface of the flexible member 401 on which the output pad 403 is disposed. Further, the connecting unit 407 may be disposed on the other surface of the flexible member 401 which is the same as the drive chip 405. That is, the connecting unit 407 and the drive chip 405 may be disposed on the other surface of the flexible member 401 which is different from the output pad 403 which is disposed on one surface of the flexible member 401.

That is, the drive chip 405 which drives the display panel 470 and the connecting unit 407 may be directly mounted in the printed circuit unit 300 to be integrally formed. The drive chip 405 and the connecting unit 407 may be disposed on the other surface of the printed circuit unit. That is, the drive chip 405 and the connecting unit 407 may be disposed on the same surface of the printed circuit unit 400. Further, the drive chip 405 and the connecting unit 407 may be disposed on the other surface which is different from that of the output pad 400 of the printed circuit unit 403.

The display panel 470 includes a pad unit corresponding to the output pad 403 of the printed circuit unit 400 and the pad unit of the display panel 470 and the output pad 403 of the printed circuit unit 400 may be electrically connected. In this case, the display panel 470 connected to the output pad 403 may be bent in an area connected to the output pad 403. Therefore, the printed circuit unit 400 may be disposed below the bent display panel 470. Therefore, the drive chip 405 and the connecting unit 407 disposed on the other surface of the flexible member 401 of the printed circuit unit 400 are not disposed in a space between the flexible member 401 and the display panel 470. As a result, the space (gap) between the printed circuit unit 400 and the bent display panel 470 may be minimized.

Further, the drive chip 405 and the connecting unit 407 may have particular thicknesses. The thicknesses of the drive chip 405 and the connecting unit 407 may vary in accordance with product design specifications, and the thicknesses may be larger than the space between the bent display panel 470 and the printed circuit unit 400. In this case, the drive chip 405 and the connecting unit 407 may not be disposed in the space between the bent display panel 470 and the printed circuit unit 400. Therefore, the drive chip 405 and the connecting unit 407 having relatively large thicknesses may be disposed on the other surface of the flexible member 401 of the printed circuit unit 400.

In this case, the system board 450 may be disposed above or below the printed circuit unit 400. When the system board 450 is disposed on one surface of the printed circuit unit 400, the system board may be disposed in the space between the printed circuit unit 400 and the bent display panel 470. In this case, the system board 450 is disposed in the space, so that the thickness of the bent display device 490 may be minimized.

Figure 5:
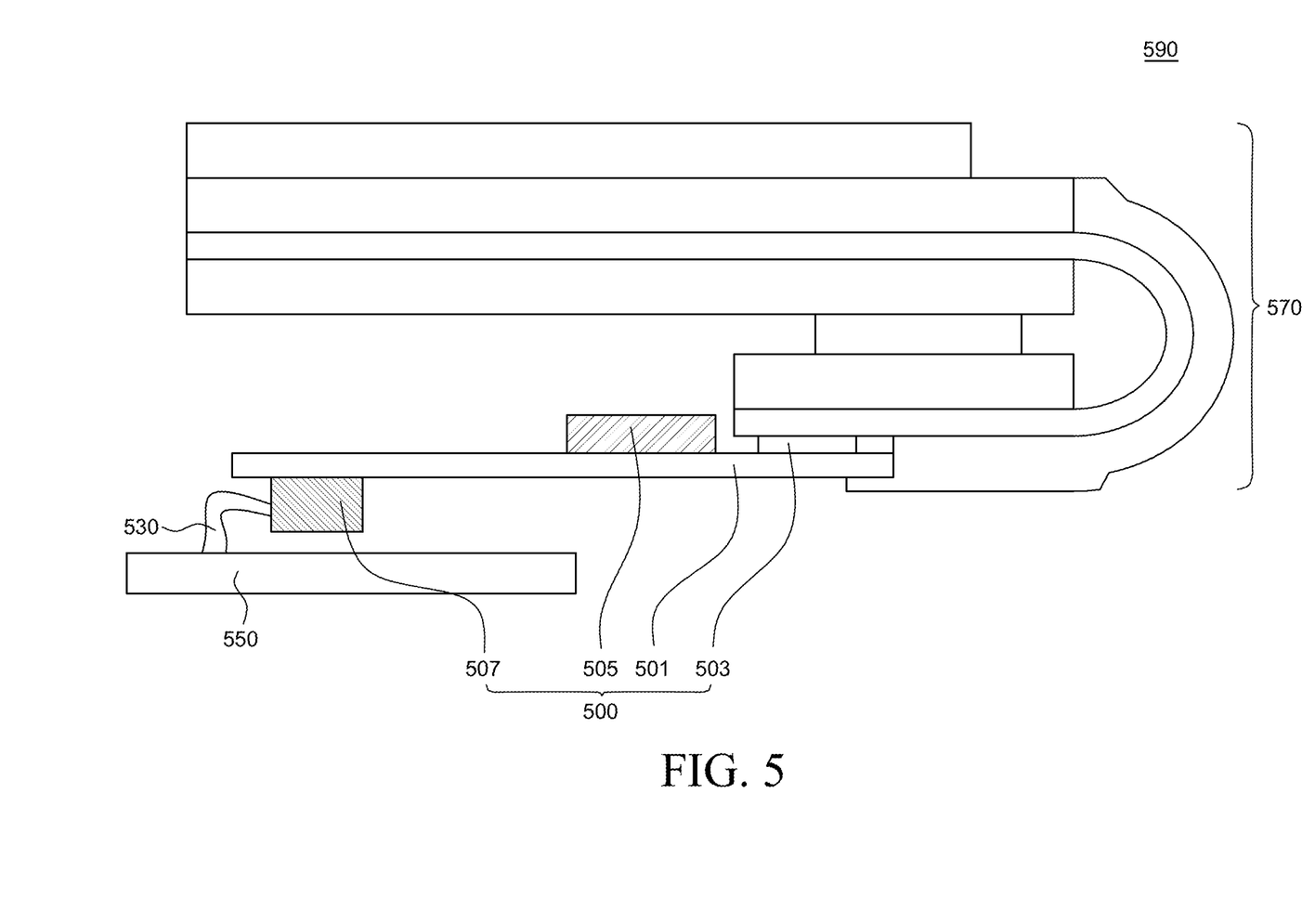
FIG. 5 is a schematic cross-sectional view for explaining a display device including a printed circuit unit equipped with a drive chip according to still another exemplary aspect of the present disclosure.

FIG. 5 is a schematic cross-sectional view for explaining a display device including a printed circuit unit equipped with a drive chip according to still another exemplary aspect of the present disclosure.

As compared with the display device illustrated in FIG. 3, in FIG. 5, some parts of the printed circuit unit are changed, but other components are substantially the same. Therefore, a redundant description will be omitted.

As illustrated in FIG. 5, a printed circuit unit 500 includes a flexible member 501, a wiring layer, a drive chip 505, a connecting unit 507, and an output pad 503.

The flexible member (e.g. thin film substrate) 501 has an upper surface and a lower surface and includes a first end and a second end. In this case, the upper surface of the flexible member 501 faces a bent display panel 570 and the lower surface of the flexible member 501 is directed to an opposite direction of the bent display panel 570.

The output pad 503 may be disposed on the upper surface of the flexible member 501. In this case, the output pad 503 may be disposed at the first end of the flexible member 501. In this case, the output pad 503 may be implemented to connect the bent display panel 570 and the printed circuit unit 500.

The connecting unit 507 may be disposed on the lower surface of the flexible member 501. In this case, the connecting unit 507 may be disposed at the second end of the flexible member 501. The connecting unit 507 may be implemented to be connected to the system board 550.

The drive chip 505 may be disposed on the upper surface of the flexible member 501. That is, the connecting unit 507 and the drive chip 505 may be disposed on different surfaces of the flexible member 501. As described above, according to the arrangement of the connecting unit 507 and the drive chip 505, the flexible member 501 may be implemented by a shape which is not a rectangle in a plan view. Further, the printed circuit unit 500 may be implemented to secure a degree of freedom of a design on the upper surface and the lower surface of the flexible member 501.

Specifically, the flexible member 501 of the printed circuit unit 500 includes the output pad 503 including an output electrode which protrudes from one surface of the flexible member 501. Further, the drive chip 505 and the connecting unit 507 are mounted to be in contact with the flexible member 501. In this case, the drive chip 505 may be disposed on the same surface as one surface of the flexible member 501 on which the output pad 503 is disposed. Further, the connecting unit 507 may be disposed on the other surface corresponding to one surface of the flexible member 501. That is, the connecting unit 503 may be disposed on the other surface of the flexible member 501 which is different from the one surface of the flexible member 501 on which the drive chip 505 and the output pad 503 are disposed.

That is, the drive chip 505 which drives the display panel 570 and the connecting unit 507 may be directly mounted in the printed circuit unit 500 to be integrally formed. The drive chip 505 and the connecting unit 507 may be disposed on different surfaces of the printed circuit unit 500. In this case, the output pad 503 and the drive chip 505 may be disposed on the same surface. Further, the connecting unit 503 may be disposed on the other surface which is different from that of the output pad 503 and the drive chip 505 of the printed circuit unit 500.

The display panel 570 includes a pad unit corresponding to the output pad 503 of the printed circuit unit 500 and the pad unit of the display panel 570 and the output pad 503 of the printed circuit unit 500 may be electrically connected. In this case, the display panel 570 connected to the output pad 503 may be bent in an area connected to the output pad 503. Therefore, the printed circuit unit 500 may be disposed below the bent display panel 570. Therefore, the drive chip 505 disposed on one surface of the flexible member 501 of the printed circuit unit 500 may be disposed in a space between the printed circuit unit 500 and the bent display panel 570. Further, the connecting unit 507 disposed on the other surface of the flexible member 501 of the printed circuit unit 500 is not disposed in the space between the printed circuit unit 500 and the bent display panel 570.

In this case, the connecting unit 507 may have a particular thickness. The thickness of the connecting unit 507 may vary in accordance with product design specifications, and the thickness may be larger than the space between the bent display panel 570 and the printed circuit unit 500. In this case, the connecting unit 507 may not be disposed in the space between the bent display panel 570 and the printed circuit unit 500. Therefore, the connecting unit 407 having a relatively large thickness may be disposed on the other surface of the flexible member 500 of the printed circuit unit 501. That is, the printed circuit unit 500 may be designed by changing the arrangement of the drive chip 505 and the connecting unit 507 in accordance with the design of the display device 590. Accordingly, the degree of freedom of a design of the printed circuit unit 500 on which the drive chip 505 and the connecting unit 507 are disposed may be improved.

Figure 6:
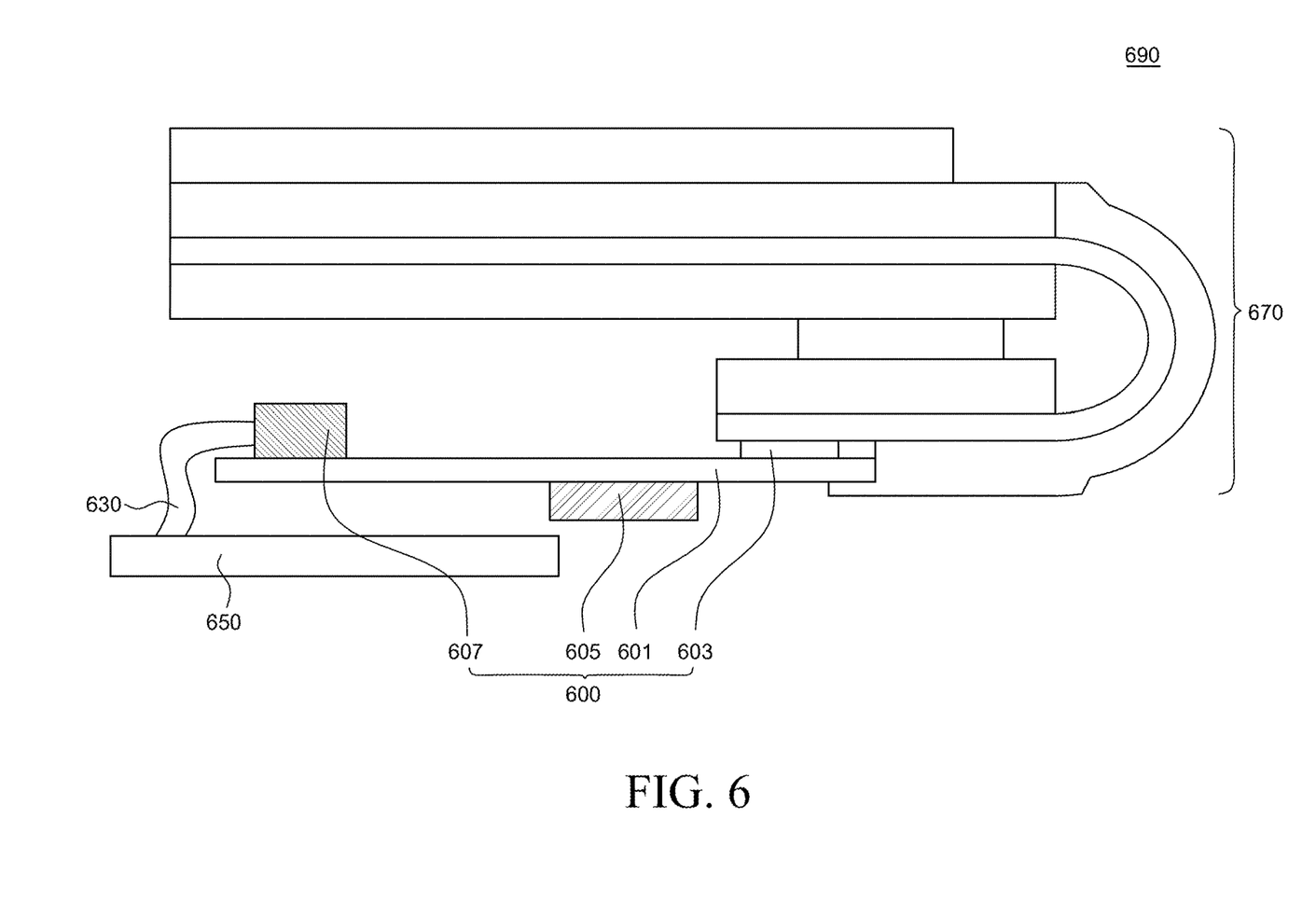
FIG. 6 is a schematic cross-sectional view for explaining a display device including a printed circuit unit equipped with a drive chip according to still another exemplary aspect of the present disclosure.

FIG. 6 is a schematic cross-sectional view for explaining a display device including a printed circuit unit including a drive chip according to still another exemplary aspect of the present disclosure.

As compared with the display device illustrated in FIG. 3, in FIG. 6, a structure of the printed circuit unit is changed, but other components are substantially the same. Therefore, a redundant description will be omitted.

As illustrated in FIG. 6, a printed circuit unit 600 includes a flexible member 601, a wiring layer, a drive chip 605, a connecting unit 607, and an output pad 603.

The flexible member (e.g. thin film substrate) 601 has an upper surface and a lower surface and includes a first end and a second end. In this case, the upper surface of the flexible member 601 faces a bent display panel 670 and the lower surface of the flexible member 601 is directed to an opposite direction of the bent display panel 670.

The output pad 603 may be disposed on the upper surface of the flexible member 601. In this case, the output pad 603 may be disposed at the first end of the flexible member 601. In this case, the output pad 603 may be implemented to connect the bent display panel 670 and the printed circuit unit 600.

The connecting unit 607 may be disposed on the upper surface of the flexible member 601. In this case, the connecting unit 607 may be disposed at the second end of the flexible member 601. The connecting unit 607 may be implemented to be connected to the system board 650.

The drive chip 605 may be disposed on the lower surface of the flexible member 601. That is, the connecting unit 607 and the drive chip 605 may be disposed on the different surfaces of the flexible member 601. As described above, according to the arrangement of the connecting unit 607 and the drive chip 605, the flexible member 601 may be implemented by a shape which is not rectangular in a plan view.

Further, the printed circuit unit 600 may be implemented to secure a degree of freedom of a design on the upper surface and the lower surface of the flexible member 601.

Specifically, the flexible member 601 of the printed circuit unit 600 includes the output pad 603 including an output electrode which protrudes from one surface of the flexible member 601. Further, the drive chip 605 and the connecting unit 607 are mounted to be in contact with the flexible member 601. In this case, the connecting unit 607 may be disposed on the same surface as one surface of the flexible member 601 on which the output pad 603 is disposed. Further, the drive chip 605 may be disposed on the other surface corresponding to one surface of the flexible member 601. That is, the drive chip 605 may be disposed on the other surface of the flexible member 601 which is different from the one surface of the flexible member 601 on which the connecting unit 607 and the output pad 603 are disposed.

That is, the drive chip 605 which drives the display panel 670 and the connecting unit 607 may be directly mounted in the printed circuit unit 600 to be integrally formed. The drive chip 605 and the connecting unit 607 may be disposed on different surfaces of the printed circuit unit 600. In this case, the output pad 603 and the connecting unit 607 may be disposed on the same surface. Further, the drive chip 605 may be disposed on the other surface which is different from that of the output pad 603 and the connecting unit 607 of the printed circuit unit 600.

The display panel 670 includes a pad unit corresponding to the output pad 603 of the printed circuit unit 600 and the pad unit of the display panel 670 and the output pad 603 of the printed circuit unit 600 may be electrically connected. In this case, the display panel 670 connected to the output pad 603 may be bent in an area connected to the output pad 603. Therefore, the printed circuit unit 600 may be disposed below the bent display panel 670. Therefore, the connecting unit 607 disposed on one surface of the flexible member 601 of the printed circuit unit 607 may be disposed in a space between the printed circuit unit 600 and the bent display panel 670. Further, the drive chip 605 disposed on the other surface of the flexible member 601 of the printed circuit unit 600 is not disposed in the space between the printed circuit unit 600 and the bent display panel 670.

In this case, the connecting unit 607 may be disposed between the printed circuit unit 600 and the bent display panel 670. The connecting unit 607 having a particular thickness is disposed in a space between the printed circuit unit 600 and the bent display panel 670. Therefore, the thickness of the bent display device 690 may be reduced by as much as the thickness of the connecting unit 307. That is, the thickness of the display device 690 may be minimized by changing the arrangement of the connecting unit 607 of the printed circuit unit 600.

Further, the drive chip 605 may have a particular thickness. The thickness of the drive chip 605 may vary in accordance with a design, and the thickness may be larger than the space between the bent display panel 670 and the printed circuit unit 600. In this case, the drive chip 605 may not be disposed in the space between the bent display panel 670 and the printed circuit unit 600. Therefore, the drive chip 605 having a relatively large thickness may be disposed on the other surface of the flexible member 601 of the printed circuit unit 600. That is, the printed circuit unit 600 may be designed by changing the arrangement of the drive chip 605 and the connecting unit 607 in accordance with the design of the display device 690. Accordingly, the degree of freedom of a design of the printed circuit unit 600 on which the drive chip 605 and the connecting unit 609 are disposed may be improved.

The exemplary aspects of the present disclosure can also be described as follows:

According to an aspect of the present disclosure, A display device, comprises a printed circuit film having at least two electrode layers and having a contact pad, a system board connected to a connector in the printed circuit film, a display panel connected to the contact pad, the display panel being bent, and a driving unit, which drives the display panel, and in which the driving unit and the connector are directly mounted on the printed circuit film to be integrally formed.

The driving unit and the connector may be on the same one surface of the printed circuit film.

The one surface may be a surface facing a rear surface of the display panel.

The driving unit and the connector may be located between the printed circuit film and the display panel to reduce a thickness of the display device.

The driving unit and the connector may be located on different surfaces of the printed circuit film and an arrangement of the driving unit and the connector of the printed circuit film may be based upon a design of the display device.

The driving unit and contact pad may be on the same one surface of the printed circuit film.

The connector may be on the same one surface on which the driving unit is disposed.

The connector may be on the other surface opposite to the one surface.

The driving unit and contact pad may be located on different surfaces of the printed circuit film.

The connector may be on the same surface on which the driving unit is disposed.

The connector may be on the same surface on which the contact pad is disposed.

According to an another aspect of the present disclosure, a printed circuit board includes a flexible member having an upper surface and a lower surface and including a first end and a second end, an output pad at the first end and connected to a bent display panel, a connecting unit at the second end and connected to a system board, and a drive chip between the output pad and the connecting unit.

The upper surface of the flexible member may face towards the bent display panel, the lower surface of the flexible member faces away from the bent display panel.

Both the connecting unit and the drive chip may be on the upper surface of the flexible member and the lower surface of the flexible member may be implemented to be used as a space for another purpose.

Both the connecting unit and the drive chip may be on the lower surface of the flexible member and a space between the flexible member and the bent display panel facing the upper surface of the flexible member is reduced.

The connecting unit and the drive chip may be on different surfaces to provide increased circuit design arrangement possibilities for the flexible member.

The connecting unit may be at the second end of the flexible member, and both the connecting unit and the drive chip may be on the same surface or on different surfaces so that the flexible member has a shape which is different from a rectangle in a plan view.

According to an yet another aspect of the present disclosure, a printed circuit unit includes a thin film substrate having an upper surface and a lower surface, an integrated circuit, on the thin film substrate, which performs certain processing of signals for a display panel and signals for a system control board, and an integrated connector, integrated into the thin film substrate, that provides an electrical interface between the integrated circuit and the display panel and between the integrated circuit and the system control board, which forgoes the need of a separate printed circuit board having a separate connector thereon.

The integrated connector may have a connecting unit at one end thereof that provides an interface with the system control board, a contact pad unit at another end thereof that provides an interface with the display panel, and multi-layered wiring that provides electrical connections between the integrated circuit, the connecting unit, and the contact pad unit.

The multi-layered wiring may include at least two conductive layers stacked together but insulated from each other, and provides a conductive path between the integrated circuit, the connecting unit, and the contact pad unit via contact holes leading to at least one of the upper and lower surfaces of the thin film substrate.

The multi-layered wiring may include one or more terminals on at least one among the upper and lower surfaces of the thin film substrate that allow additional electrical elements to be connected to the integrated connector.

The display panel may be flexible with at least one end that is folded over and operatively connected with the contact pad unit.

The integrated circuit and the connecting unit may be both on the same surface among the upper and lower surfaces of the thin film substrate.

The integrated circuit and the connecting unit may be respectively on different surfaces among the upper and lower surfaces of the thin film substrate.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical features of the present disclosure. Thus, it is to be appreciated that aspects described above are intended to be illustrative in every sense, and not restrictive. The protection scope of the present disclosure should be interpreted based on the following appended claims and it should be appreciated that all technical features included within a range equivalent thereto are included in the protection scope of the present disclosure.

What is claimed is:

1. A printed circuit unit comprising:
   a flexible member having first and second surfaces and having a multi-layered wiring layer including at least two conductive layers disposed at vertically different heights;
   an circuit driving unit, on the flexible member, which performs signal processing for a display panel and a system control board;
   a contact pad unit disposed on the flexible member, which provides an electrical interface between the driving unit and the display panel; and
   a connecting unit disposed on the flexible member, which provides an electrical interface between the driving unit and the system control board, which eliminates a need of a separate printed circuit board having a separate connector thereon,
   wherein the at least two conductive layers include a first layer including a first electrode and a first protective layer covering the first electrode, and a second layer including a second electrode and a second protective layer covering the second electrode, and the first electrode and the second electrode are insulated from each other, wherein the driving unit and the connecting unit directly contact the first protective layer, and the first electrode and the second electrode are distanced from first and second surfaces of the flexible member, and wherein the driving unit and the contact pad unit directly contact one electrode of the first electrode and the second electrode via a contact hole and the driving unit and the connecting unit directly contact the other electrode via a contact hole.

2. The printed circuit unit of claim 1, wherein the connecting unit disposed at one end of the flexible member, the contact pad unit disposed at another end of the flexible member, and the driving unit disposed between the connecting unit and the contact pad unit, wherein the connecting unit, the contact pad unit and the driving unit are spaced apart from each other.

3. The printed circuit unit of claim 1, wherein the one electrode provides a conductive path between the driving unit and the contact pad and the other electrode provides a conductive path between the driving unit and the connecting unit.

4. The printed circuit unit of claim 1, wherein the first electrode electrically connected to the driving unit and the contact pad via a contact hole through the first protective layer, wherein the other electrode electrically connected to the driving unit and the connecting unit via a contact hole through both the first protective layer and the second protective layer.

5. The printed circuit unit of claim 1, wherein the display panel is flexible with at least one end that is capable of being folded over and operatively connected with the contact pad unit.

6. The printed circuit unit of claim 1, wherein the driving unit and the connecting unit are disposed both on the same surface of one of the first and second surfaces of the flexible member.

7. The printed circuit unit of claim 5, wherein the integrated circuit and the connecting unit are respectively disposed on different surfaces of the first and second surfaces of the thin film substrate.

8. The printed circuit unit of claim 1, wherein the contact pad unit directly contacts the first electrode and protrudes from the first protective layer.

* * * * *